US 7,994,829 B2

(12) United States Patent
Hsieh et al.

(10) Patent No.: US 7,994,829 B2
(45) Date of Patent: Aug. 9, 2011

(54) FAST LOCK-IN ALL-DIGITAL PHASE-LOCKED LOOP WITH EXTENDED TRACKING RANGE

(75) Inventors: Hong-Yean Hsieh, Santa Clara, CA (US); Chao-Cheng Lee, Hsin-Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/580,556

(22) Filed: Oct. 16, 2009

(65) Prior Publication Data

US 2011/0089982 A1    Apr. 21, 2011

(51) Int. Cl.
H03L 7/06 (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 7,256,629 B2* | 8/2007 | Zachan et al. | ................ | 327/156 |
| 7,436,227 B2* | 10/2008 | Thomsen et al. | ............ | 327/147 |
| 7,436,229 B2* | 10/2008 | Sidiropoulos et al. | ........ | 327/157 |
| 7,808,288 B2* | 10/2010 | Chatterjee | ...................... | 327/156 |
| 7,839,225 B2* | 11/2010 | Huang | .............................. | 331/74 |
| 7,884,655 B2* | 2/2011 | Marton et al. | ................. | 327/156 |
| 7,902,929 B2* | 3/2011 | Koukab et al. | .................. | 331/17 |
| 2007/0085579 A1* | 4/2007 | Wallberg et al. | .............. | 327/156 |
| 2007/0146024 A1* | 6/2007 | Allan | ............................. | 327/156 |
| 2008/0238505 A1* | 10/2008 | Chatterjee | ..................... | 327/157 |
| 2010/0156481 A1* | 6/2010 | Neumann | ........................ | 327/156 |
| 2011/0018596 A1* | 1/2011 | Lee et al. | ....................... | 327/156 |
| 2011/0018597 A1* | 1/2011 | Lee et al. | ....................... | 327/156 |
| 2011/0050301 A1* | 3/2011 | Perrott | ............................ | 327/156 |

* cited by examiner

*Primary Examiner* — Lincoln Donovan
*Assistant Examiner* — Adam D Houston
(74) *Attorney, Agent, or Firm* — Thomas, Kayden, Horstemeyer & Risley, LLP

(57) ABSTRACT

An apparatus and a method for achieving lock-in of a phase-locked loop (PLL) are disclosed. The PLL receives a reference clock and generates an output clock according to the reference clock. The method comprises: adjusting an oscillation frequency of a controlled oscillator of the PLL close to a desired frequency by counting the number of rising edges of a first clock in a number of a second clock cycles; aligning a rising edge of a third clock and a rising edge of a fourth clock by temporarily changing the oscillation frequency of the digitally controlled oscillator; and locking the phases of the third and fourth clocks by a phase detector of the PLL, wherein the first and the third clocks correspond to the output clock and the second and fourth clocks correspond to the reference clock.

25 Claims, 10 Drawing Sheets

$K_{DCOM}$ =38.4MHz/bit $\Delta F_{MAXM}$ (tuning ranges) = 921.6MHz

Rising edges align.

FAST LOCK-IN ALL-DIGITAL PHASE-LOCKED LOOP WITH EXTENDED TRACKING RANGE

BACKGROUND OF THE INVENTION

1. Field of the Invention

The present invention relates generally to a phase-locked loop (PLL), and more particularly to a fast lock-in phase-locked loop.

2. Description of the Background Art

Deep-submicron technology favors digitally intensive designs due to its smallfeature sizes, low supply voltages, large gate leakage currents, etc. The small feature size significantly reduces the area cost of a digital circuit whereas the area of an analog circuit generally does not scale well with the feature size. The low supply voltage limits the headroom of an analog circuit whereas a digital circuit has better noise immunity than the analog counterpart due to its binary operation nature. Even more, the jitter of an analog phase-locked loop (PLL) is usually subjected to leakage currents in a monolithic sub-micron low pass filter. In contrast, a digital low pass filter can completely eliminate this problem to improve the jitter performance.

A number of analog circuits in an analog phase-locked loop are mitigated to digital circuits in an all-digital phase-locked loop. A voltage-controlled oscillator is converted to a digitally controlled oscillator. An analog loop filter is replaced with a digital loop filter. A charge-pump phase-frequency detector can be replaced with an equivalently digital timing-error detector.

Many design variations of an all-digital phase-locked loop arise due to a specific application and a communication specification. A problem common to each of the design variations is the need for the loop to minimize the lock-in time either from start-up or from switching bands. Lock-in time is defined as the time that is required to acquire lock from an initial loop condition. In a traditional phase-locked loop, the lock-in time is proportional to the square of the frequency difference between oscillators' initial and final frequencies. It is also inversely proportional to the cubic of the loop bandwidth.

SUMMARY OF THE INVENTION

One of the objects of the present invention provides an apparatus and a method to reduce the above-mentioned problems.

One of the objects of the present invention provides an apparatus and a method to reduce the lock-in time. The resultant lock-in time is rather insensitive to the frequency difference between oscillators' initial and final frequencies.

One of the objects of the present invention provides an apparatus and a method to reduce the lock-in time. The resultant lock-in time is rather insensitive to the loop bandwidth.

The present invention pertains to an all-digital phase-locked loop. The all-digital phase-locked loop comprises a digitally controlled oscillator wherein a LC-tank and several tuning circuits are included. Each tuning circuit may include a number of tuning circuit elements. The tuning circuit element may be a metal oxide metal (MOM), a coarse varactor, an integer varactor, and even a fractional varactor. In the digitally controlled oscillator, the operating frequency is adjusted by enabling or disabling a number of tuning circuit elements.

In one embodiment, an apparatus and a method are provided in the present invention to extend the tracking range over voltage and temperature variations when an all-digital phase-locked loop is in lock. The proposed invention respectively enables and disables tuning circuit elements of a first tuning circuit and a second tuning circuit when the enabled tuning circuit elements in the second tuning circuit are larger than an upper bound. Similarly the tuning circuit elements of the first tuning circuit and the second tuning circuit are disabled and enabled respectively when the enabled tuning circuit elements in the second tuning circuit are smaller than a lower bound. The present invention prevents the failure of a system when a system does not have enough tracking range to cover the frequency changes over voltage and temperature variations.

The first tuning circuit may include a number of coarse varactors to approximately determine the oscillation frequency for process variations. The second tuning circuit may include a number of integer varactors to exactly determine the oscillation frequency over voltage and temperature variations. The tuning resolution of the coarse varactor is much larger than the tuning resolution of the integer varactor for better tracking performance. To have a wider tracking range over voltage and temperature variations and a finer tuning resolution to achieve better tracking performance, the number of tuning circuit elements in the second tuning circuit is usually large. To extend the tracking range and minimize area cost, a tuning circuit element in the first tuning circuit is enabled and a number of tuning circuit elements in the second tuning circuit are disabled when the enabled tuning circuit elements in the second tuning circuit are larger than an upper bound. Similarly, a tuning circuit element in the first tuning circuit is disabled and a number of tuning circuit elements in the second tuning circuit are enabled when the enabled tuning circuit elements in the second tuning circuit are smaller than a lower bound.

In one embodiment, an apparatus and a method are provided in the present invention to achieve fast lock-in. The method comprises of adjusting the oscillation frequency of a digitally controlled oscillator close to the desired frequency by counting the number of rising edges of a first clock in a number of a second clock cycles, aligning a rising edge of a third clock and a rising edge of a fourth clock by temporarily increasing the oscillation frequency of the digitally controlled oscillator, and locking the phases of the third and fourth clocks by a bang-bang phase detector. The first and third clocks are divided clocks from the digitally controlled oscillator clock and the second and fourth clocks are divided clocks from the reference clock.

The lock-in process is divided into four steps: initial frequency tuning, coarse frequency tuning, edge alignment, and phase locking. In the initial and coarse frequency tuning steps, a MOM tuning circuit element and a coarse varactor is enabled or disabled, respectively, based on a counted number of rising edge of the first clock in a number of the second clock cycles. After the initial and coarse frequency tuning steps complete, the oscillation frequency of the digitally controlled oscillator is very close to the desired frequency. In the edge alignment step, a rising edge of the third clock and a rising edge of the fourth clock are aligned. The alignment is detected by checking lead or lag relationships between the third and fourth clocks. The oscillation frequency of the digitally controlled oscillator is first increased with a fixed number of the coarse varactors temporarily disabled. After a consecutive number of lags of the third clock reported by the bang-bang phase detector are followed by a lead, the edge alignment step completes and the temporarily disabled coarse varactors are enabled again. After the edge alignment step completes, the oscillation frequency of the DCO is very close to the desired frequency and the rising edges of the third and fourth clocks align. Finally, the bang-bang phase detector enables or disables the tuning circuit elements in the integer and fractional tuning circuits to adjust the oscillation frequency of the digitally controlled oscillator.

After the all-digital phase-locked loop acquires lock, it can maintain lock by the bang-bang phase detector. The bang-bang phase detector generates output signals EARLY and LATE to detect lead and lag phase relationship between the third and fourth clocks. The phase error filtered by a low-pass filter is used to generate an integer tuning word and a fractional tuning word. The integer tuning word instructs an integer controller to enable or disable the tuning circuit elements in the integer tuning circuit. The fractional tuning word instructs a fractional controller to enable or disable the tuning circuit elements in the fractional tuning circuit.

These and other features of the present invention will be readily apparent to persons of ordinary skill in the art upon reading the entirety of this disclosure, which includes the accompanying drawings and claims.

BRIEF DESCRIPTION OF THE DRAWINGS

The present invention will become more fully understood from the detailed description given herein below for illustration only, and thus are not limitative of the present invention, wherein.

The use of the same reference label in different drawings indicates the same or like components.

DETAILED DESCRIPTION OF EMBODIMENTS OF THE INVENTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
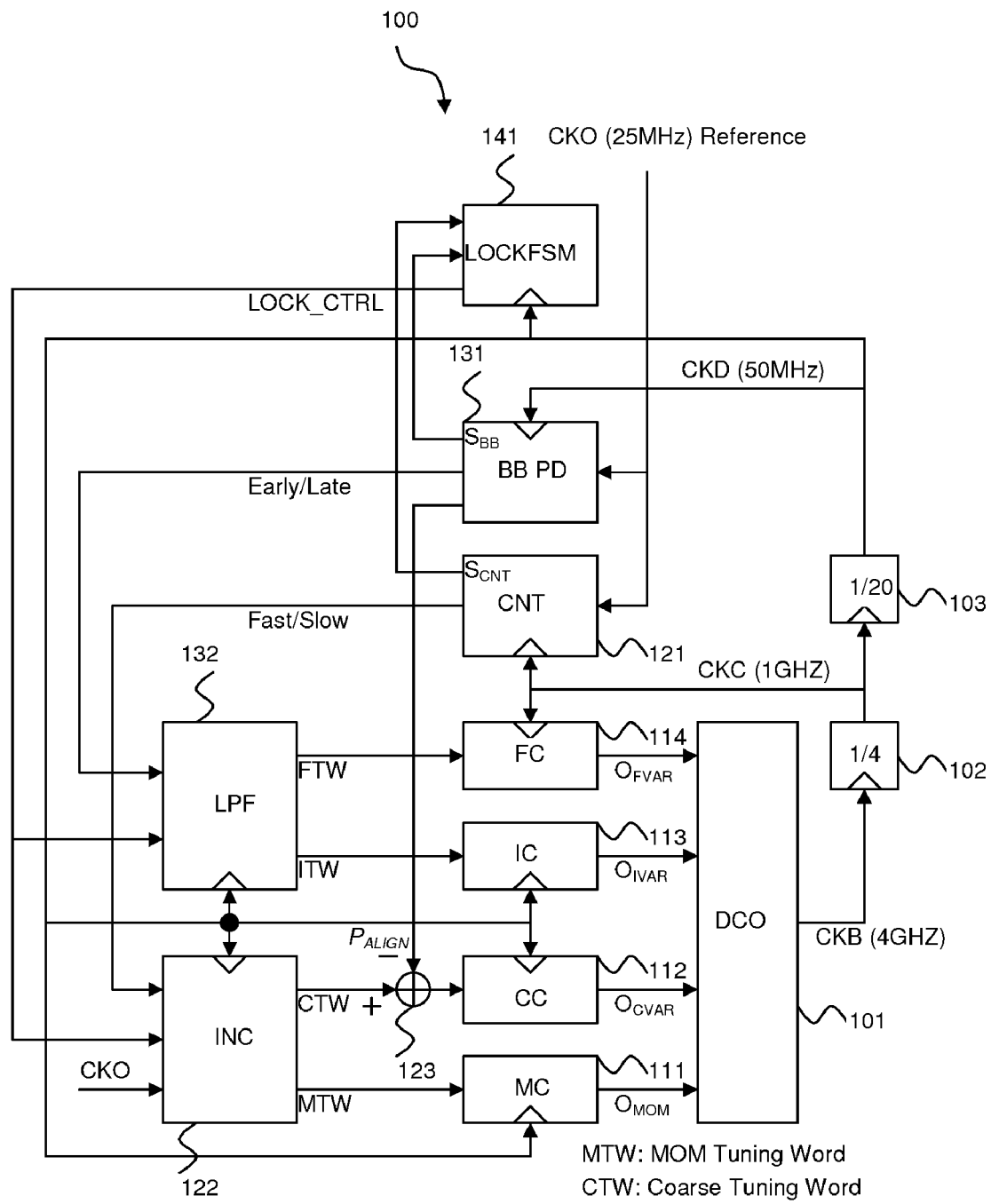
FIG. 1 shows an all-digital phase-locked loop in accordance with an embodiment of the present invention.

Embodiments of the present invention advantageously allow for fabrication of an all-digital controlled phase-locked loop. FIG. 1 shows an all-digital phase-locked loop in accordance with an embodiment of the present invention. The all-digital phase-locked loop comprises a digitally controlled oscillator (DCO) 101, a divide-by-N frequency divider 102 (for example, N=4), a divide-by-M frequency divider 103, a MOM controller (MC) 111, a coarse controller (CC) 112, an integer controller (IC) 113, a fractional controller (FC) 114, a comparison circuit 121, an incrementer (INC) 122, an adder 123, a phase detector (PD) 131, a low-pass filter (LPF) 132, and a lock-in finite state machine (LOCKFSM) 141. The all-digital phase-locked is configured to receive a reference clock CKO and to generate a DCO clock CKB. In an embodiment, N=4, M=20. In another embodiment, the phase detector 131 is a bang-bang phase detector. In an embodiment, the comparison circuit 121 is a counter (CNT).

The digitally controlled oscillator 101 may be implemented in a variety of ways.

Figure 2:
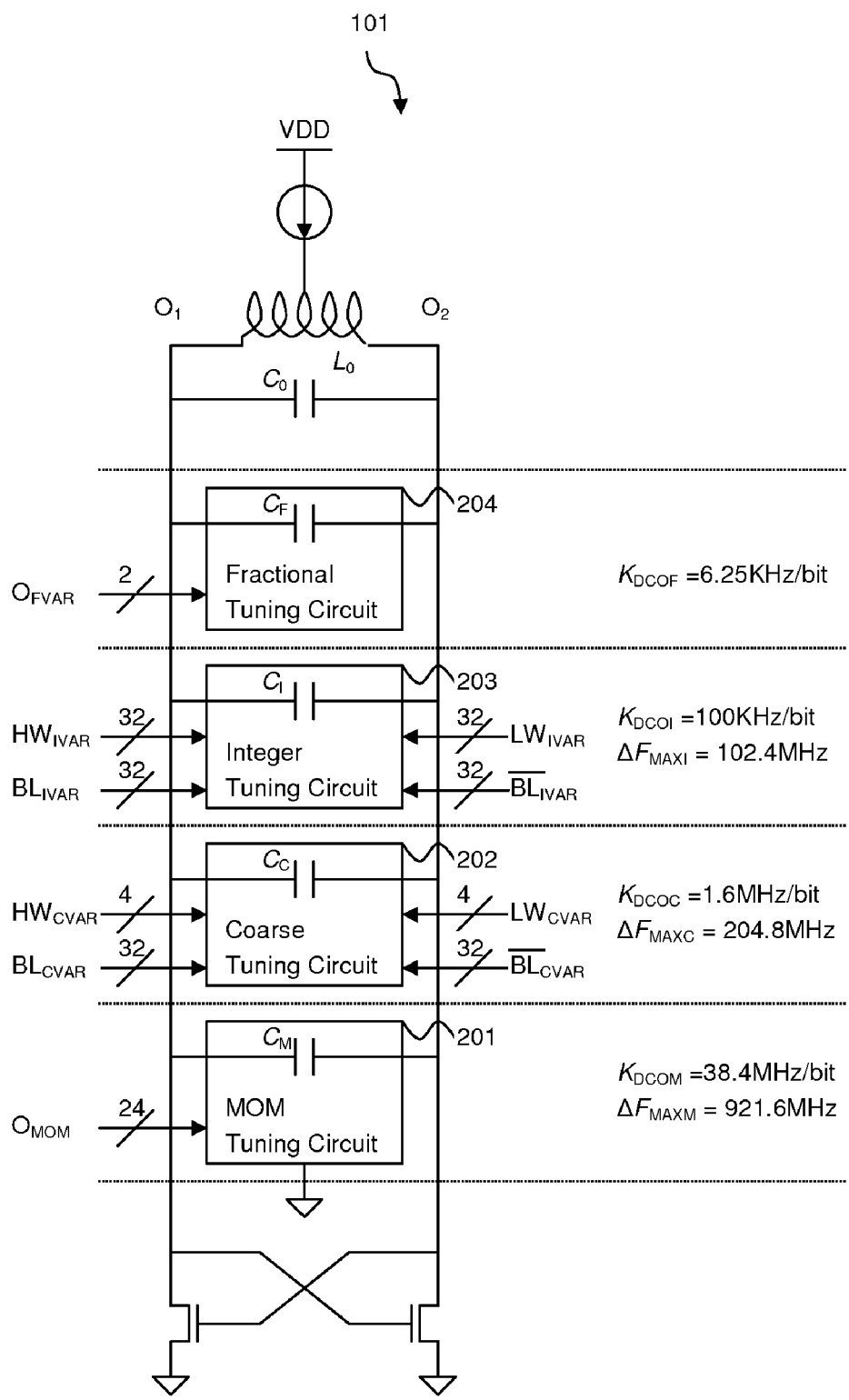
FIG. 2 shows a digitally controlled LC-tank oscillator in accordance with an embodiment of the present invention.

For example, in one embodiment, FIG. 2 shows the digitally controlled oscillator 101 that is fabricated with a LC-tank and one or more tuning circuits. The LC-tank comprises a shunt connection of an inductance with an inductance value of $L_0$ and a capacitor with a capacitance value of $C_0$. The tuning circuits include a MOM tuning circuit 201, a coarse tuning circuit 202, an integer tuning circuit 203, and a fractional tuning circuit 204. Digital control signals enable/disable the tuning circuit elements in each tuning circuit to adjust the capacitance value. Out of all the tuning circuit, the MOM tuning circuit 201 has the largest tuning resolution of $K_{DCOM}$. In other words, enabling/disabling one tuning circuit element in the MOM tuning circuit 201 gives the largest frequency deviation. The next is the coarse tuning circuit 202 and then is the integer tuning circuit 203. The fractional tuning circuit 204 has the smallest tuning resolution of $K_{DCOF}$. Therefore enabling/disabling one tuning circuit element in the fractional tuning circuit 204 gives the smallest frequency deviation. As will be appreciated by persons skilled in the art, the digitally controlled oscillator 101 may be implemented in a variety of ways, and therefore detailed illustrations and discussions of such circuitry need not be described herein.

In an embodiment, each tuning circuit determines a capacitance value. Enabling a tuning circuit element in each tuning circuit decreases the oscillation frequency of the digitally controlled oscillator and disabling a tuning circuit element increases the oscillation frequency. The oscillating frequency of the DCO clock CKB is determined by the inductance value of $L_0$, the capacitance value of $C_0$ and the capacitance values of all the tuning circuits. For example, the MOM tuning circuit has a capacitance value of $C_1$, the coarse tuning circuit has a capacitance value of $C_2$, the integer tuning circuit has a capacitance value of $C_3$, and the fractional tuning circuit has a capacitance value of $C_4$. The oscillation frequency of the digitally controlled oscillator 101 is then determined by the sum of the capacitance values of all the tuning circuits connected to the LC tank and the capacitance value in the LC tank. The exact formula of the oscillation frequency is $$1/(2\pi\sqrt{L_0(C_0+C_1+C_2+C_3+C_4)}).$$

Figure 3:
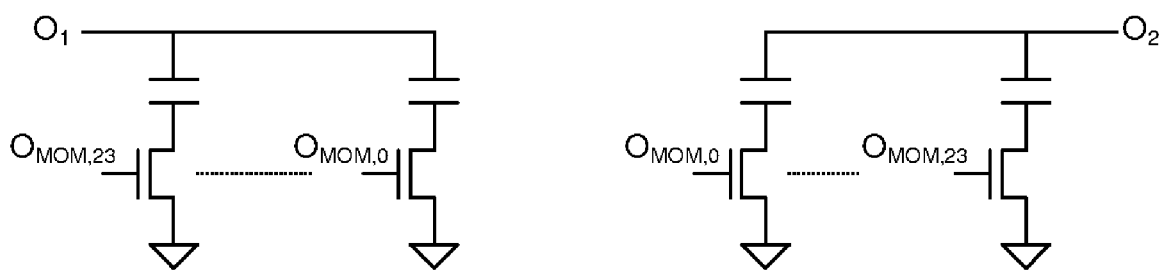
FIG. 3 schematically shows a MOM tuning circuit in accordance with an embodiment of the present invention.

FIG. 3 shows the MOM tuning circuit 201 in accordance with an embodiment of the present invention. There are a total of 24 pairs of MOMs (metal oxide metal) in the tuning circuit. A MOM is enabled when the associated NMOS (n-type metal-oxide-semiconductor) is turned on. In an embodiment, this results in a tuning range ($\Delta F_{MAXM}$) of 921.6 MHz and a tuning resolution ($K_{DCOM}$) of 38.4 MHz/bit. The MOM tuning circuit 201 receives digital control signals from the MOM controller (MC) 111 to enable/disable its tuning circuit elements.

Figure 4A:
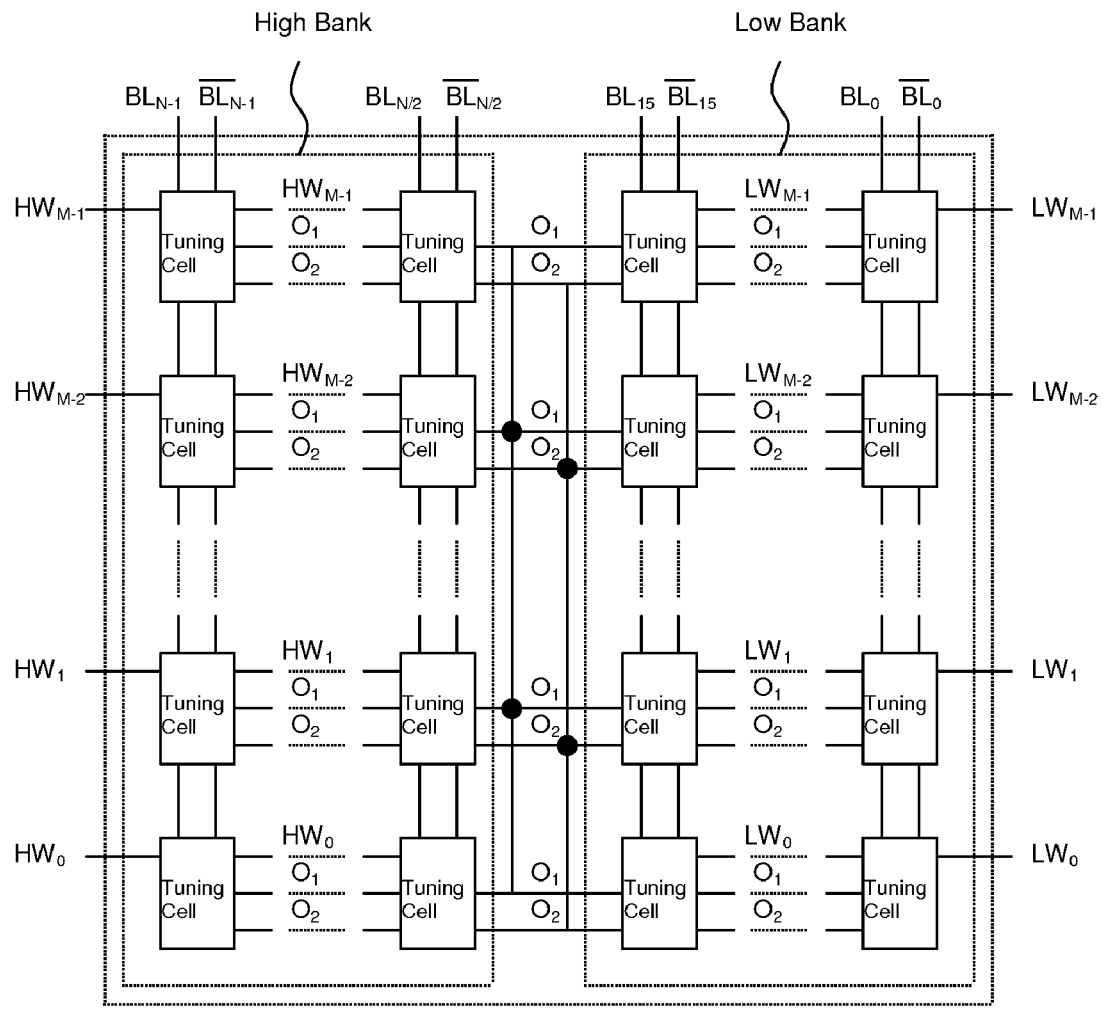
FIG. 4(a) schematically shows a dual bank of tuning cells in accordance with an embodiment of the present invention.
Figure 4B:
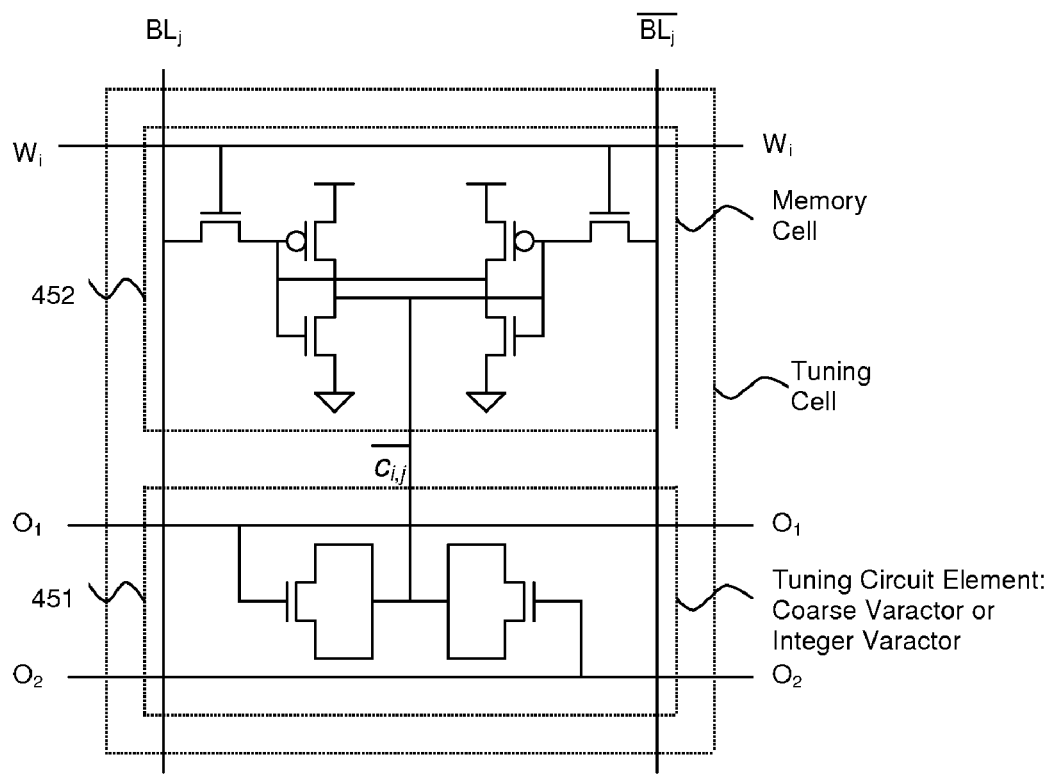
FIG. 4(b) schematically shows a tuning cell that includes a memory cell and a tuning circuit element in accordance with an embodiment of the present invention.

The coarse tuning circuit 202 and the integer tuning circuit 203 are each formed by a dual bank of tuning cells. FIG. 4(a) shows a dual bank of tuning cells and FIG. 4(b) shows a tuning cell in accordance with an embodiment of the present invention. Each of said tuning cells comprises a tuning circuit element 451 and a memory cell 452. The tuning circuit element 451 can be a coarse varactor or an integer varactor and is enabled and disabled, respectively, by writing a binary one and zero into the associated memory cell 452. The tuning resolutions of the coarse tuning circuit 202 and the integer tuning circuit 203 are 1.6 MHz/bit and 100 kHz/bit, respectively. In an embodiment, there are a total of 128 coarse tuning cells and 1024 integer tuning cells, respectively, in the coarse tuning circuit 202 and the integer tuning circuit 203. The resultant tuning ranges of the coarse tuning circuit 202 and the integer tuning circuit 203 are 204.8 MHz and 102.4 MHz, respectively. The coarse tuning circuit 202 and the integer tuning circuit 203 receive digital control signals from the coarse controller (CC) 112 and the integer controller (IC) 113, respectively, to enable/disable their tuning circuit elements.

Figure 5A:
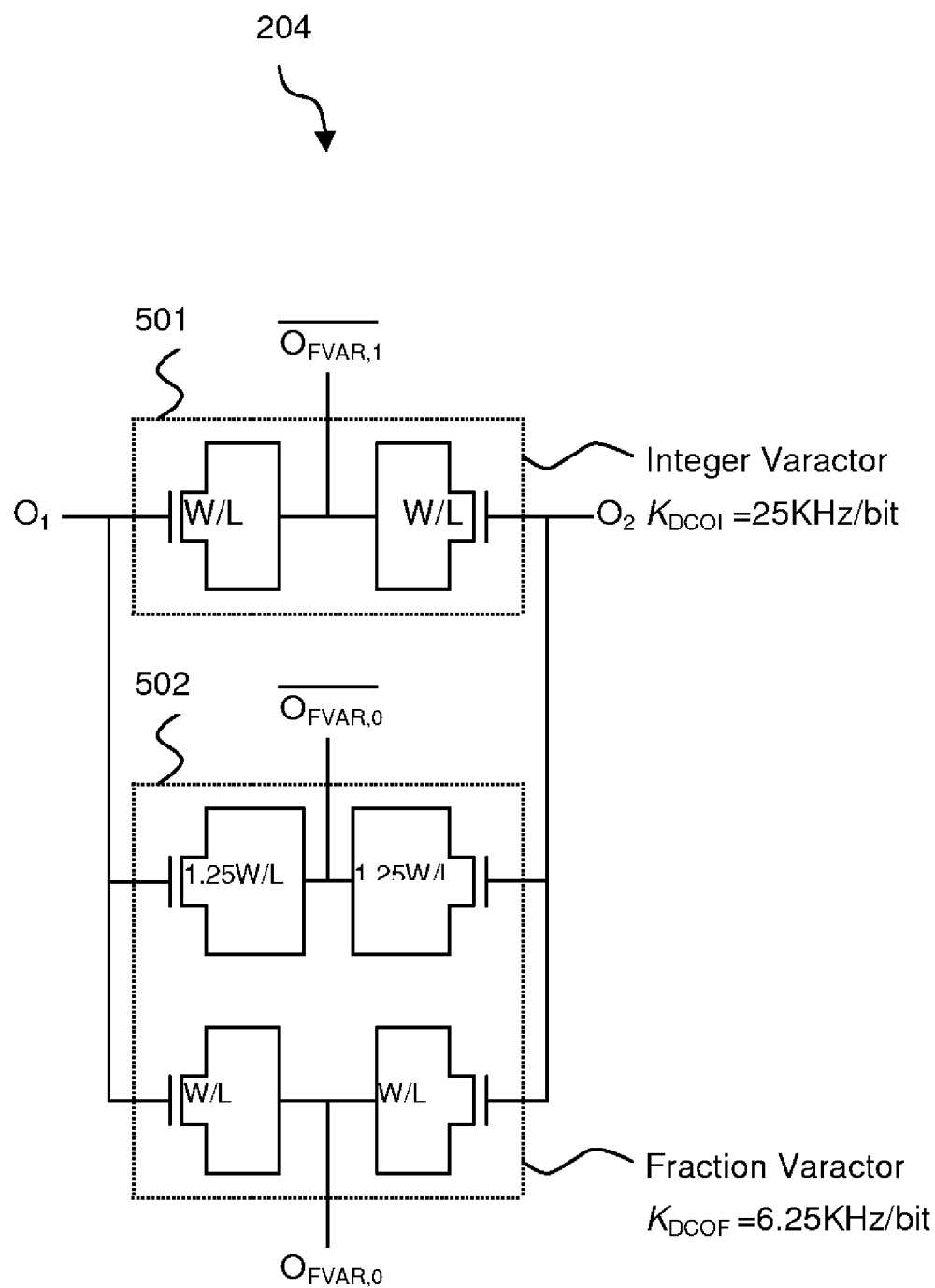
FIG. 5(a) schematically shows a fractional tuning circuit in accordance with an embodiment of the present invention.

In one embodiment, FIG. 5(a) schematically shows the fractional tuning circuit 204 in accordance with an embodiment of the present invention. The fractional tuning circuit 204 comprises an integer varactor 501 and a fractional varactor 502 that are clocked by a high-speed clock CKC. In an embodiment, the high-speed clock CKC is a divide-by-4 clock of the DCO clock CKB. The fractional varactor 502 is implemented with two unequal sized varactors. For example, one of them has the same size as an integer varactor and the other has its size larger than an integer varactor by 25%. When one is enabled, the other is disabled, and vice versa. The tuning resolution of the fractional varactor 502 is one fourth of tuning resolution of the integer varactor 501.

Figure 5B:
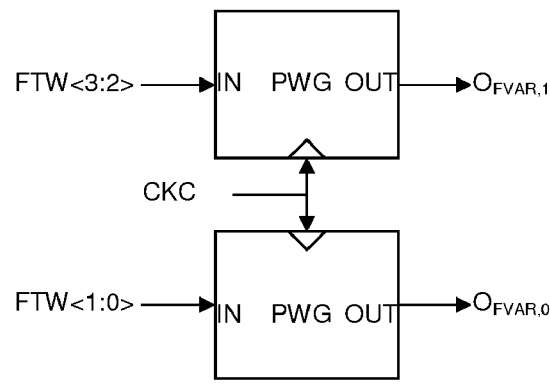
FIG. 5(b) schematically shows a pulse waveform modulator in accordance with an embodiment of the present invention.
Figure 5C:
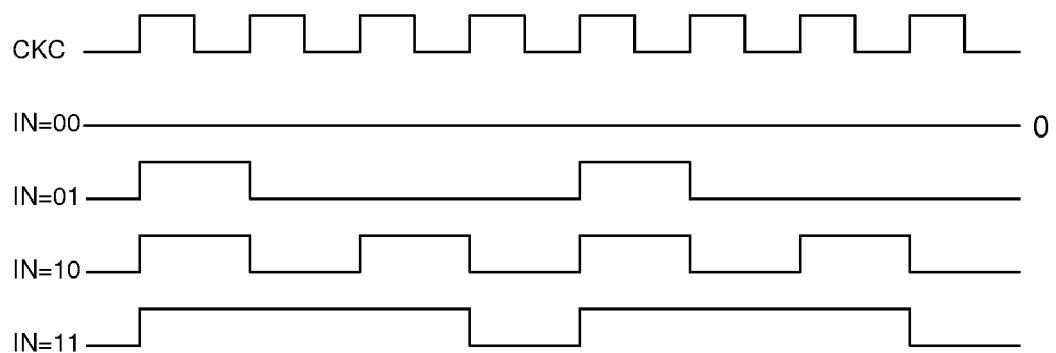
FIG. 5(c) shows a timing diagram of the pulse waveform modulator in FIG. 5(b).

In one embodiment, FIG. 5(b) shows that the integer varactor 501 is enabled/disabled in response to the first two most significant bits of the fractional tuning word (FTW) and the fractional varactor 502 is enabled/disabled in response to the remaining two bits of the fractional tuning word (FTW). The fractional tuning word (FTW) is coupled to the input of two pulse waveform generators (PWG) in the fractional controller (FC) 114 to generate pulse width modulated waveforms that enable/disable the integer varactor 501 and the fractional varactor 502. FIG. 5(c) shows one embodiment of the generated waveforms. For the two input bits of the pulse waveform generator equal to 11, 10, 01, and 00, three, two, one, and zero cycles out of the four high-speed clock cycles are set to a binary one, respectively. The pulse width modulated waveforms effectively enable the tuning circuit element in a variable pulse width that corresponds its two input bits. The high-speed clock then time averages the enabled and disabled capacitances. The low-rate fractional bits are effectively converted to a high-speed pulse width modulated waveform. In this case, the resultant tuning resolution becomes one fourth of the original value. For the integer varactor 501 and the fractional varactor 502, their tuning resolutions are reduced from 100 KHz/bit and 25 KHz/bit to 25 KHz/bit and 6.25 KHz/bit, respectively, with the pulse width modulated waveform. The fractional tuning circuit 204 receives digital control signals from the fractional controller (FC) 114 to enable/disable the tuning circuit elements.

When the all-digital phase-locked loop is in lock, it updates the integer tuning circuit 203 and fractional tuning circuit 204 to track the reference clock CKO over voltage and temperature variations. The update reflects the change of a digital tuning word that comprises an integer tuning word (ITW) and a fractional tuning word (FTW). The integer tuning word is used to instruct the integer controller 113 to enable/disable the tuning circuit elements in the integer tuning circuit 203. And the fractional tuning word is used to instruct the fractional controller 114 to enable/disable the tuning circuit elements in the fractional tuning circuit 204. In a preferred embodiment, the size of the tuning circuit elements in the integer tuning circuit 203 is usually selected to cover the required tuning range over voltage and temperature variations.

In one embodiment, an apparatus and a method are provided in the present invention to extend the tracking range when the all-digital phase-locked loop is in lock. The proposed invention respectively enables and disables tuning circuit elements of a first tuning circuit and a second tuning circuit when the enabled tuning circuit elements in the second tuning circuit are larger than an upper bound. Similarly the tuning circuit elements of the first tuning circuit and the second tuning circuit are disabled and enabled respectively when the enabled tuning circuit elements in the second tuning circuit are smaller than a lower bound. The present invention prevents the failure of a system when the system does not have enough tuning circuit elements in the second tuning circuit to cover the frequency changes over voltage and temperature variations.

Figure 6:
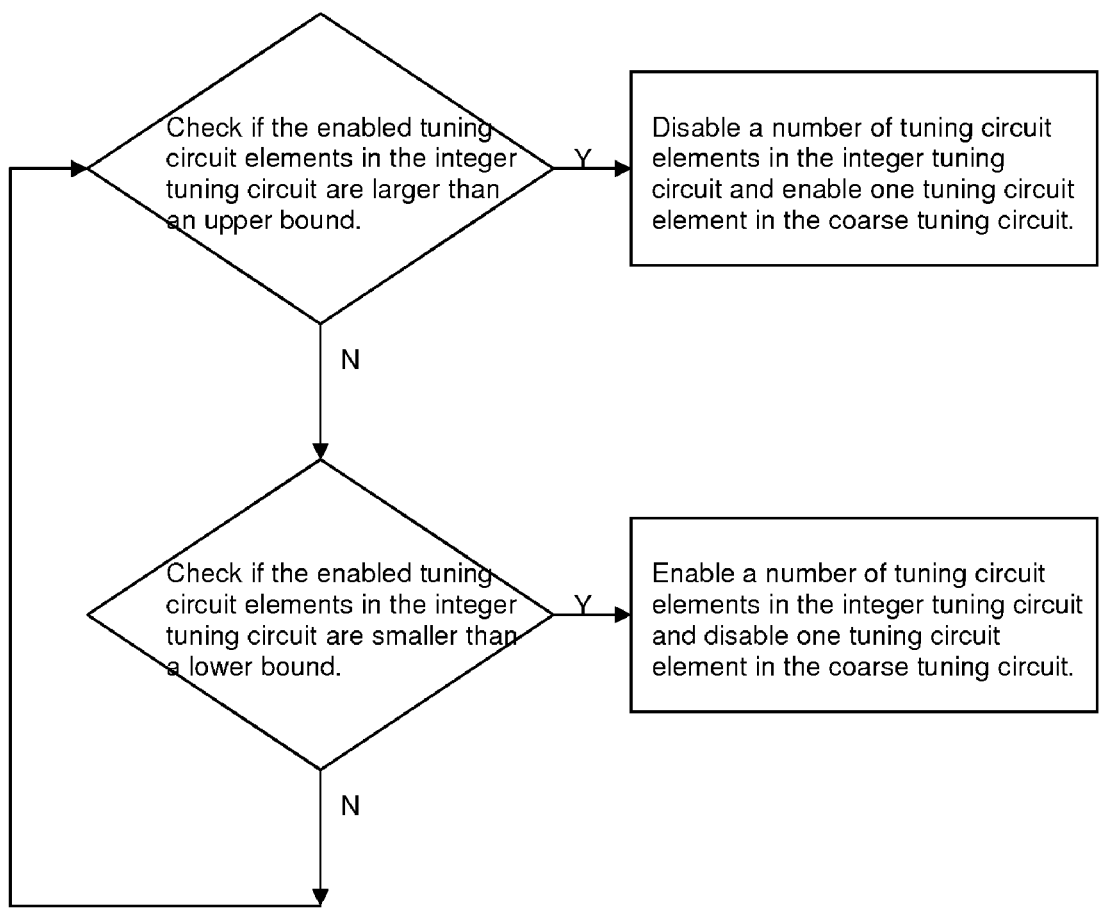
FIG. 6 shows an algorithm to swap the coarse and integer tuning circuit elements in accordance with an embodiment of the present invention.

In one embodiment, the first tuning circuit can be the coarse tuning circuit 202 and the second tuning circuit can be the integer tuning circuit 203. To have a wider tracking range over voltage and temperature variations and a finer tuning resolution to achieve better tracking performance, the number of tuning circuit elements in the integer tuning circuit is usually large. FIG. 6 shows an algorithm to swap the coarse and integer tuning circuit elements in accordance with an embodiment of the present invention. A tuning circuit element in the coarse tuning circuit 202 is enabled and a number of tuning circuit elements in the integer tuning circuit 203 is disabled when the enabled tuning circuit elements in the integer tuning circuit 203 are larger than an upper bound. Similarly, a tuning circuit element in the coarse tuning circuit 202 is disabled and a number of tuning circuit elements in the integer tuning circuit 203 are enabled when the enabled tuning circuit elements in the integer tuning circuit 203 are smaller than a lower bound.

Figure 8:
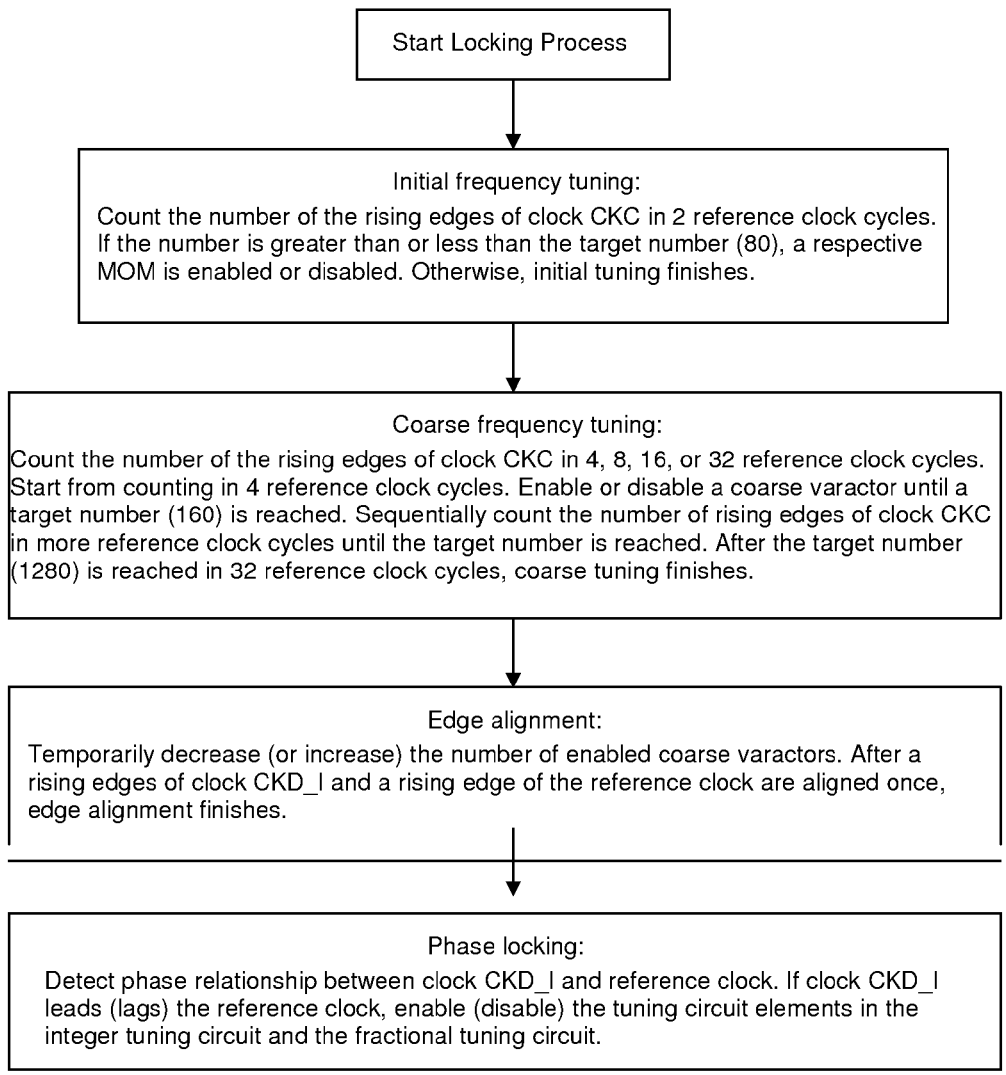
FIG. 8 shows a lock-in algorithm in accordance with an embodiment of the present invention.

One of characteristics of the all-digital phase-locked loop according to the embodiment of this present invention is a shorter lock-in time. In one embodiment, an apparatus and a method are provided in the present invention to achieve fast lock-in. FIG. 8 shows an algorithm to achieve fast lock-in. The method comprises of adjusting the oscillation frequency of the digitally controlled oscillator close to the desired frequency by counting the number of rising edges of a first clock in a number of a second clock cycles, aligning a rising edge of a third clock and a rising edge of a fourth clock by temporarily increasing the oscillation frequency of the digitally controlled oscillator, and locking the phases of the third and fourth clocks by a bang-bang phase detector. The first and third clocks are divided clocks from the DCO clock and the second and fourth clocks are divided clocks from the reference clock.

The lock-in process starts from adjusting the oscillation frequency of the digitally controlled oscillator close to the desired frequency. This is done by counting the number of rising edges of the first clock in a number of the second clock cycles with the counter CNT. The first clock is the divide-by-4 clock CKC from the DCO clock CKB. The second clock can be a divided clock from the reference clock CKO and in one embodiment the second clock is just the reference clock CKO. If the number of rising edges of the first clock in a number of the second clock cycles is larger than a target number, it represents that the DCO clock is faster and the counter 121 outputs a binary one in a signal net Fast/Slow. If the number of rising edges of the first clock in a number of the second clock cycles is smaller than a target number, it represents that the DCO clock is slower and the counter 121 outputs a binary zero in the signal net Fast/Slow. In accordance with the binary value in the signal net Fast/Slow, the incrementer (INC) 122 in FIG. 1 outputs either a MOM tuning word (MTW) to the MOM controller 111 or a coarse tuning word (CTW) to the coarse controller 112. The MOM controller 111 and the coarse controller 112 then enable a tuning circuit element in the MOM tuning circuit 201 and in the coarse tuning circuit 202, respectively, if the DCO clock is faster. Similarly, the MOM controller 111 and the coarse controller 112 then disable a tuning circuit element in the MOM tuning circuit 201 and in the coarse tuning circuit 202, respectively, if the DCO clock is slower.

After the oscillation frequency of the digitally controlled oscillator is adjusted close to the desired frequency, a rising edge of the third clock is then aligned with a rising edge of the fourth clock. The third clock CKD is a divide-by-80 (i.e. $\frac{1}{4} \times \frac{1}{20}$) clock from the DCO clock CKB. The fourth clock can be a divided clock from the reference clock CKO and in one embodiment the fourth clock is just the reference clock CKO. The detection of the alignment is indicated from the lead-lag relationships between the third and fourth clocks. If the third clock lags the fourth clock, the bang-bang phase detector (BBPD) 131 outputs a binary one in an output signal LATE. If the third clock leads the fourth clock, the bang-bang phase detector 131 outputs a binary one in an output signal EARLY. The oscillation frequency of the digitally controlled oscillator DCO is first increased with a fixed number of the coarse varactors temporarily disabled. After a number of lags of the third clock reported by the bang-bang phase detector are followed by a lead, the edge alignment step completes and the temporarily disabled coarse varactors are enabled again. After the edge alignment step completes, the oscillation frequency of the DCO is very close to the desired frequency and the rising edges of the third and fourth clocks align.

Figure 7A:
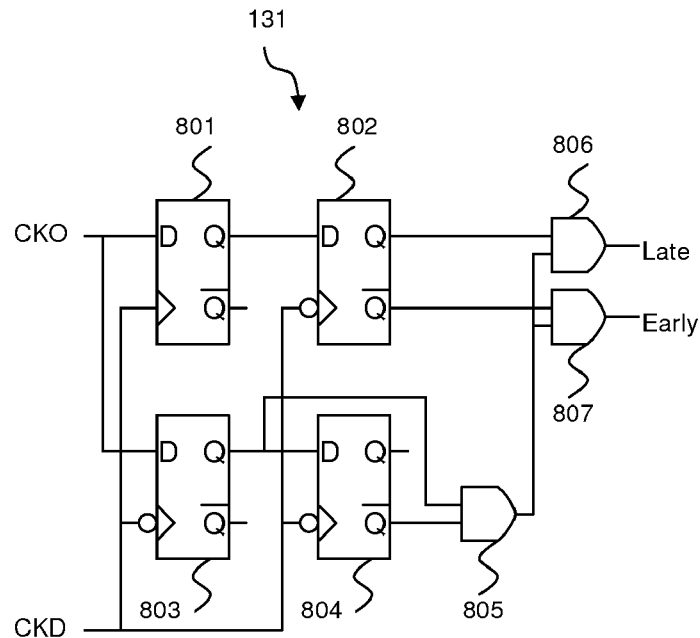
FIG. 7(a) shows a bang-bang phase detector in accordance with an embodiment of the present invention.
Figure 7B:
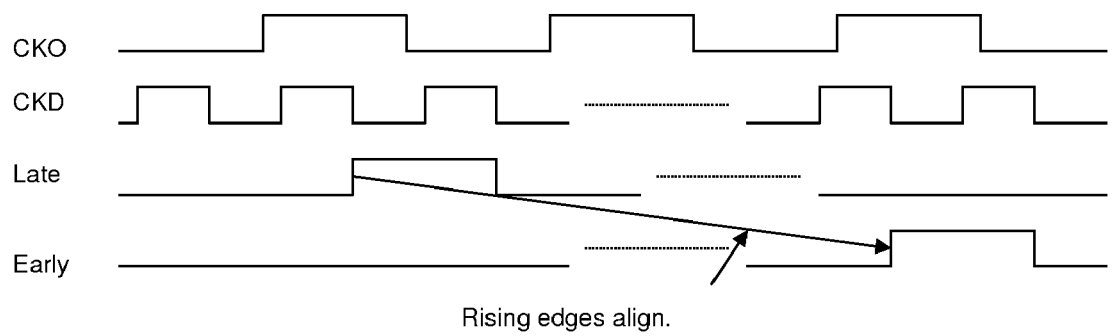
FIG. 7(b) shows a timing diagram of the bang-bang phase detector in FIG. 8(a).

In one embodiment, FIG. 7(a) shows the phase detector 131 in accordance with the present invention. The phase detector 131 is configured to receive the third and the fourth clocks and to generate the output signal LATE and the output signal EARLY. The phase detector 131 comprises four flip-flops and three AND logic gates. A rising edge of the third clock samples the fourth clock at flip-flop 801 and the sampled result is resynchronized by the flip-flop 802 at the next falling edge of the third clock. The flip-flops 803, 804 and the AND gate 805 detects if the fourth clock is transited from a binary zero to a binary one for the current transition of the fourth clock. If the transition is from a binary zero to a binary one, the AND gate 805 outputs a binary one. Otherwise a binary zero is generated. If a binary one is generated by the AND gate 805 and the sampled result of the flip 801 is a binary one, it represents that the third clock lags the fourth clock and the output signal LATE is set to a binary one. If a binary one is generated by the AND gate 805 and the sampled result of the flip 801 is a binary zero, it represents that the third clock leads the fourth clock and the output signal EARLY is set to a binary one. FIG. 7(b) shows a timing diagram that illustrates the edge alignment process. After the signal LATE is set to a binary one a number of times, the alignment is completed when the signal EARLY is set to a binary one.

Finally the phase detector 131 enables or disables the tuning circuit elements in the integer circuit 203 and the fractional tuning circuit 204 to adjust the oscillation frequency of the digitally controlled oscillator 101.

The lock-in process is divided into four steps: initial frequency tuning, coarse frequency tuning, edge alignment, and phase locking. In the initial and coarse frequency tuning steps, a MOM tuning circuit element and a coarse varactor is enabled or disabled, respectively, based on a counted number of rising edge of the first clock in a number of the second clock cycles. After the initial and coarse frequency tuning steps complete, the oscillation frequency of the digitally controlled oscillator 101 is very close to the desired frequency. In the edge alignment step, a rising edge of the third clock and a rising edge of the fourth clock are aligned. The detection of the alignment is obtained from checking the lead-lag relationships between the third and fourth clocks. After the edge alignment step completes, the phase detector 131 enables or disables the tuning circuit elements in the integer and fractional tuning circuits to adjust the oscillation frequency of the digitally controlled oscillator.

After the all-digital phase-locked loop acquires the locking, it can maintain lock by the phase detector. The phase detector generates the lag and lead phase relationship between the third and fourth clocks. The lead or lag phase error is filtered by a low-pass filter to generate the integer tuning word and the fractional tuning word. The integer tuning word instructs the integer controller 113 to enable or disable the tuning circuit elements in the integer tuning circuit 203. The fractional tuning word instructs the fractional controller 114 to enable or disable the tuning circuit elements in the fractional tuning circuit 204. In an embodiment, the phase detector 131 can be a bang-bang phase detector.

A phase-locked loop has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for generating an output clock, the apparatus comprising:
   a controlled oscillator, to generate the output clock according to a tuning signal;
   a frequency divider, to divide the output clock to generate a first clock and a third clock, wherein a frequency of the first clock is higher than a frequency of the third clock;
   a comparison circuit, to compare the first clock and a second clock to produce a comparison signal;
   a phase detector (PD), to detect a difference between the third clock and a fourth clock to generate a detection signal;
   a finite state machine (FSM), to generate a state signal according to at least one of the detection signal and the comparison signal;
   a filter, to produce a first control signal according to the detection signal and the state signal; and
   a first circuit, to produce a second control signal according to the comparison signal and the state signal;
   a control circuit, to produce the tuning signal according to the first control signal and the second control signal.

2. The apparatus of claim 1, wherein the first circuit is an incrementer.

3. The apparatus of claim 1, wherein the control circuit comprises:

a first controller, coupled to the filter, to receive the first control signal and to generate a first tuning word of the tuning signal; and a second controller, coupled to the first circuit, to receive the second control signal and to generate a second tuning word of the tuning signal.

4. The apparatus of claim 3, wherein the first controller comprises a fractional controller and an integer controller, and the second controller comprises a metal oxide metal (MOM) controller and a coarse controller.

5. The apparatus of claim 4, wherein the controlled oscillator comprises a fractional tuning circuit, an integer tuning circuit, a coarse tuning circuit, and a metal oxide metal (MOM) tuning circuit.

6. The apparatus of claim 1, wherein the controlled oscillator comprises a metal oxide metal (MOM) tuning circuit.

7. The apparatus of claim 1, wherein the controlled oscillator comprises an integer tuning circuit comprising a plurality of tuning circuit elements, the size of the tuning circuit elements in the integer tuning circuit is selected to cover the required tuning range over voltage and temperature variations.

8. The apparatus of claim 1, wherein the controlled oscillator comprises a tuning circuit comprising an integer varactor and a fractional varactor, and the fractional varactor is implemented with two unequal sized varactors.

9. The apparatus of claim 1, wherein the comparison circuit comprises a counter.

10. The apparatus of claim 1, wherein the phase detector comprises a bang-bang phase detector.

11. The apparatus of claim 1, wherein the second clock and the fourth clock are a reference clock.

12. The apparatus of claim 1, wherein the frequency divider comprises:
a first divider to generate the first clock according to the output clock; and
a second divider to generate the third clock according to the output clock.

13. A method for achieving lock-in of a phase-locked loop (PLL) which receives a reference clock and generates an output clock according to the reference clock, the method comprising:
adjusting an oscillation frequency of a controlled oscillator of the PLL close to a desired frequency by counting the number of rising edges of a first clock in a number of a second clock cycles;
aligning a rising edge of a third clock and a rising edge of a fourth clock; and
locking the phases of the third and fourth clocks by a phase detector of the PLL;
wherein the first and the third clocks correspond to the output clock.

14. The method according to claim 13, wherein the second and the fourth clocks correspond to the reference clock.

15. The method according to claim 14, wherein the second clock is the reference clock.

16. The method according to claim 14, wherein the fourth clock is the reference clock.

17. The method according to claim 13, wherein the first clock is generated by dividing the frequency of the output clock.

18. The method according to claim 17, wherein the third clock is generated by dividing the frequency of the output clock.

19. The method according to claim 13, wherein the frequency of the first clock is higher than that of the third clock.

20. The method according to claim 13, wherein the controlled oscillator comprises at least two of a fractional tuning circuit, an integer tuning circuit, a coarse tuning circuit, and a metal oxide metal (MOM) tuning circuit.

21. The method according to claim 13, wherein the controlled oscillator comprises a tuning circuit comprising an integer varactor and a fractional varactor, and the fractional varactor is implemented with two unequal sized varactors.

22. The method according to claim 13, wherein the controlled oscillator comprises a plurality of tuning circuit elements, the size of the tuning circuit elements is selected to cover the required tuning range over voltage and temperature variations.

23. The method according to claim 13, wherein the aligning a rising edge of the third clock and a rising edge of the fourth clock is achieved by temporarily changing the oscillation frequency of the controlled oscillator.

24. An apparatus for receiving an input clock and generating an output clock, comprising:
a controlled oscillator, to generate the output clock according to a tuning signal;
a phase detector, to detect a difference between a feedback clock and a reference clock to generate a detection signal, wherein the feedback clock corresponds to the output clock and the reference clock corresponds to the input clock;
a filter, to produce a first control signal according to the detection signal; and
a control circuit, to produce the tuning signal according to the first control signal, wherein the control circuit comprises a first tuning circuit and a second tuning circuit, and swaps the first tuning circuit and the second tuning circuit according to a swapping algorithm.

25. The apparatus of claim 24, the swapping algorithm comprising:
a tuning circuit element in the first tuning circuit is enabled and a number of tuning circuit elements in the second tuning circuit are disabled when the enabled tuning circuit elements in the second tuning circuit are larger than an upper bound; and
a tuning circuit element in the first tuning circuit is disabled and a number of tuning circuit elements in the second tuning circuit are enabled when the enabled tuning circuit elements in the second tuning circuit are smaller than a lower bound.

* * * * *